(12) United States Patent
Takayanagi

(10) Patent No.: US 8,026,741 B2
(45) Date of Patent: Sep. 27, 2011

(54) CMOS CIRCUITRY WITH MIXED TRANSISTOR PARAMETERS

(75) Inventor: Toshinari Takayanagi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 34 days.

(21) Appl. No.: 12/533,320

(22) Filed: Jul. 31, 2009

(65) Prior Publication Data

US 2011/0025375 A1   Feb. 3, 2011

(51) Int. Cl.
*H03K 19/094* (2006.01)
*H03K 3/00* (2006.01)
*H03B 1/00* (2006.01)

(52) U.S. Cl. ............... 326/83; 326/80; 327/108

(58) Field of Classification Search ............ 326/26, 326/33, 93, 98
See application file for complete search history.

(56) References Cited

U.S. PATENT DOCUMENTS

| | | | | |
|---|---|---|---|---|
| 6,433,584 B1 * | 8/2002 | Hatae | .............. | 326/80 |
| 7,145,383 B2 * | 12/2006 | Mizuno et al. | .............. | 327/546 |
| 7,504,854 B1 * | 3/2009 | Look et al. | .............. | 326/38 |
| 7,705,571 B2 | 4/2010 | Motz | | |
| 7,710,776 B2 | 5/2010 | Johal et al. | | |
| 7,723,798 B2 | 5/2010 | Doris et al. | | |
| 7,737,720 B2 * | 6/2010 | Idgunji et al. | .............. | 326/33 |
| 2004/0113672 A1 * | 6/2004 | Kang et al. | .............. | 327/185 |
| 2005/0168242 A1 * | 8/2005 | Won | .............. | 326/82 |
| 2007/0103195 A1 * | 5/2007 | Duk-Sohn et al. | .............. | 326/41 |
| 2008/0018389 A1 * | 1/2008 | Kim et al. | .............. | 327/544 |

* cited by examiner

*Primary Examiner* — Shawki S Ismail
*Assistant Examiner* — Dylan White
(74) *Attorney, Agent, or Firm* — Lawrence J. Merkel; Meyertons, Hood, Kivlin, Kowert & Goetzel, P.C.; Erik A. Heter

(57) ABSTRACT

CMOS circuitry having mixed threshold voltages is disclosed. Circuits may be implemented using PMOS transistors, NMOS transistors, or both. For at least one given type of transistor (PMOS or NMOS), a circuit includes at least one transistor configured to switch at a first nominal threshold voltage and at least one transistor configured to switch at a second nominal threshold voltage. The different threshold voltages among a given transistor type are realized by varying the thickness of the transistor gate oxides and/or the channel dopant density, for example.

18 Claims, 6 Drawing Sheets

CMOS CIRCUITRY WITH MIXED TRANSISTOR PARAMETERS

BACKGROUND

1. Field of the Invention

This invention relates to integrated circuits, and more particularly, to characteristics of transistors used in integrated circuits.

2. Description of the Related Art

CMOS integrated circuits (IC's) utilize a large number of field effect transistors (FET's). These transistors may be activated or deactivated based on a threshold voltage. More particularly, such transistors may be activated or deactivated based on a relationship between a voltage difference between gate and source terminals ($V_{gs}$) and a threshold voltage. For example, an n-type metal oxide semiconductor (NMOS) transistor may be turned on when $V_{gs}$ meets or exceeds a threshold voltage of the transistor. A p-type metal oxide semiconductor (PMOS) transistor may be turned on when $V_{gs}$ is less than or equal to the transistor's threshold voltage.

One factor that may affect the threshold voltage for a given transistor is the dopant density in the channel of the transistor. Varying the channel dopant can change the threshold voltage of the transistor. Another factor is its gate oxide thickness. Generally speaking, for otherwise similar transistors, those with a thicker gate oxide may have a higher threshold voltage. The thickness of the gate oxide may have other effects as well.

One such effect of implementing transistors with different channel dopant densities and/or a thick gate oxide (and thus higher threshold voltage) may be the reduction of sub-threshold leakage currents, particularly in low voltage circuits. Accordingly, such transistors may be useful in applications wherein reduced power consumption is desirable.

On the other hand, transistors having a lower threshold voltage may have faster switching times. Thus, transistors having a thinner gate oxide may be useful in applications where speed is a primary consideration.

SUMMARY

Circuits implemented using transistors of varying voltage thresholds are disclosed. For a given transistor type (e.g., PMOS or NMOS), circuits may include at least one transistor of a given type having a first nominal threshold voltage, and at least one transistor of the given type having a second nominal threshold voltage different from the first. Circuits including both PMOS and NMOS transistors may also be implemented using mixed threshold voltages. Such circuits may include a number of PMOS transistors, wherein certain ones of the PMOS transistors have different threshold voltages than other ones of the PMOS transistors. Circuits may also include (or alternatively, are implemented with) NMOS transistors, wherein certain ones of the NMOS transistors have different threshold voltages than other ones of the NMOS transistors.

In some embodiments, the different threshold voltages of a given type of transistor may be realized by variation of the channel dopant density among the transistors or the a gate oxide thickness among the transistors. For example, a first NMOS transistor of a given circuit may have a first nominal gate oxide thickness or first nominal channel dopant density (and correspondingly, a first nominal threshold voltage), while a second NMOS transistor of the given circuit may have a second nominal gate oxide thickness or second nominal channel dopant density (and correspondingly, a second nominal threshold voltage). Other characteristics of the transistor may also be changed to provide transistors having different nominal threshold voltages, as well as other characteristics that may affect switching speed or sub-threshold leakage current.

Circuits implemented accordance with the above may include logic gates, power switches, and any other type of circuitry based on NMOS transistors, PMOS transistors, or both. Other embodiments may implement other transistors types, such as other field effect transistors (FETs). Utilizing multiple transistors of the same type with different threshold voltages may allow the implementation of circuits that have faster switching times while also having reduced leakage currents when the circuits are inactive.

BRIEF DESCRIPTION OF THE DRAWINGS

The following detailed description makes reference to the accompanying drawings, which are now briefly described.

Figure 1:
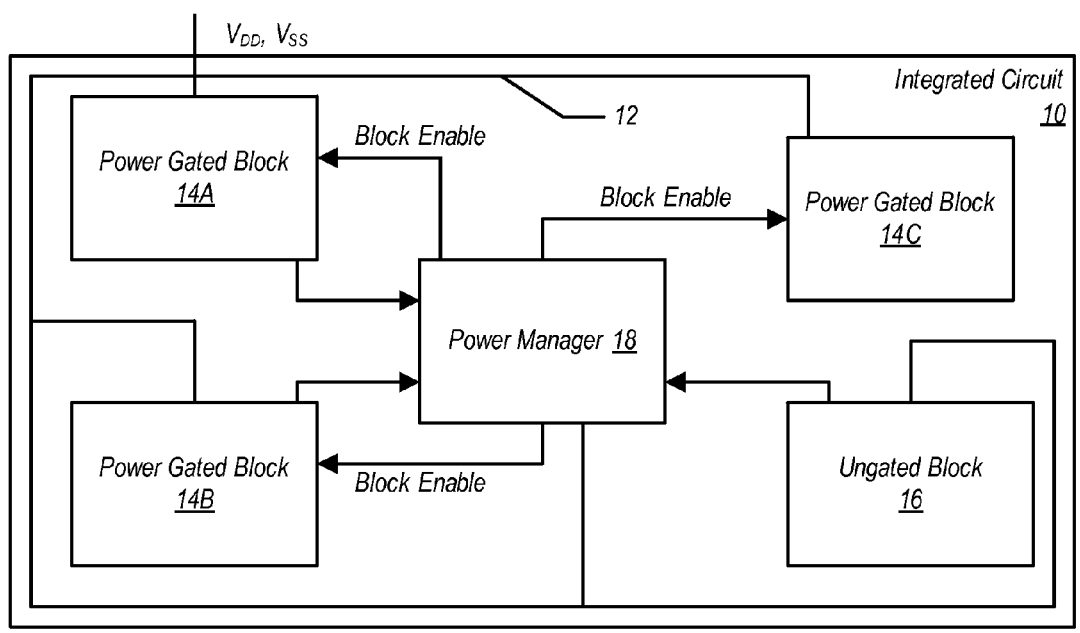
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit 10 is shown. The integrated circuit 10 is coupled to receive power supply inputs (e.g. $V_{DD}$ and $V_{SS}$, or power and ground, respectively). The $V_{DD}$ voltage may have a specified magnitude measured with respect to ground/

$V_{SS}$, during use. The integrated circuit 10 may include an interconnect, e.g. a global power supply grid for each supply voltage, to distribute the voltage over an area occupied by the integrated circuit 10 (e.g. an area at the surface of a semiconductor substrate such as silicon). The global power supply grids are illustrated in FIG. 1 as the line 12 coupled to the blocks 14A-14C, 16, and 18 in FIG. 1.

The integrated circuit 10 may include one or more power gated circuit blocks such as blocks 14A-14C. Each block 14A-14C may include circuitry such as transistors (e.g. forming logic gates) that are arranged to implement the desired operations of the integrated circuit 10, and thus may be circuit blocks (although sometimes referred to herein as simply "blocks" for brevity). For example, the blocks 14A-14C may be processors or portions thereof (e.g. execution units within the processors); interface circuitry; peripheral circuitry such as graphics processing circuitry; user interface circuitry; multimedia circuitry such as audio and/or video processing circuitry; etc.

Generally, a circuit block may include a set of related circuits that implement one or more identifiable operations. The related circuits may be referred to as logic circuits or logic circuitry, since the circuits may implement logic operations on inputs to generate outputs. Because the circuits in a given circuit block are related, they may be powered up or powered down as a unit. Each circuit block may generally be treated as a unit during the design of the integrated circuit (e.g. being physically placed within the integrated circuit as a unit).

A power gated circuit block (or simply a power gated block) may be a circuit block that may have at least one of its power supply voltages ($V_{DD}$ or $V_{SS}$) interrupted in response to de-assertion of a block enable input signal. In some embodiments, the block enable signal may be an active low signal (i.e. considered to be asserted when low), while in other embodiments the block enable signal may be active high. The power gated blocks may include power switches that are coupled to the global power supply grid and to a local power supply grid. If the enable is asserted, the power switches may electrically connect the global and local power supply grids. If the enable is de-asserted, the power switches may electrically isolate the global and local supply grids. When electrically connecting the grids, the power switch may be referred to as being on, and when electrically isolating the grids, the power switch may be referred to as being off. The voltage on the global power supply grid may flow to the local supply grid when electrically connected. However, the switches may have some impedance, and thus the voltage on the local power supply grid may differ from the voltage on the global power supply grid. The local supply voltage may be referred to as "virtual" (e.g. virtual $V_{DD}$ or virtual $V_{SS}$).

The electrical isolation of the local and global power supply grids that may be provided by the power switches may generally refer to a lack of active current flow between the grids. The power switches themselves may have leakage current, so there may be some leakage current flow. Similarly, the electrical connection of the local and global power supply grids may refer to an active current flow between the grids to provide the voltage from the global grid to the local grid. Viewed in another way, electrically connected grids may have a very low impedance path between them, whereas electrically isolated grids may have a very high impedance path. Viewed in still another way, electrically connected grids may be actively passing a voltage from one grid to the other, wherein electrically isolated grids may be preventing the passing of the voltage.

The local and global power supply grids may generally distribute a power supply voltage over various areas of the integrated circuit 10. The global power supply grids distribute the voltage over the entire area of the integrated circuit 10, while local power supply grids distribute power supply voltages within a power gated block. The ungated blocks may also include local power supply grids, but since they do not include power switches, the local power supply grids may essentially be part of the global power supply grid. In general, the power supply grids may have any configuration. For example, in one embodiment, a given block may have power supply connections to the underlying circuitry at certain physical locations (e.g. regularly spaced channels over the area). The power supply grids may include wiring running above these regularly spaced channels. There may also be wires running in the orthogonal direction to the wiring, to reduce impedance and to supply current to any localized current "hot spots". Other grids may include any sort of distribution interconnect and/or there may be irregularities in the grids, or the interconnect may essentially be a plane of metal. In one embodiment, the global power supply grids may be provided in one or more of the highest layers of metal (wiring layers), i.e. those layers that are farthest from the surface of the semiconductor substrate. The local power supply grids may be included in lower layers of metal. Connections between the power supply grids may be made to the power switches at a surface of the semiconductor substrate. The metal may be any conductive material used for interconnect in the semiconductor fabrication process used to fabricate the integrated circuit 10. For example, the metal may be copper, aluminum, tungsten, combinations thereof (e.g. aluminum or copper wiring layers and tungsten vias), alloys thereof, etc.

The power supply voltages ($V_{DD}$ and $V_{SS}$) may generally be externally supplied to the integrated circuit, and may be generally intended to be relatively static during use. While the magnitude of the supply voltages may be intentionally changed during use (e.g. for power management), the magnitude changes are not intended to be interpreted by receiving circuits in the fashion that dynamically varying signals are interpreted. Similarly, local variations in the power supply voltages may occur (such as $V_{DD}$ droop or $V_{SS}$ bounce) during operation, but these variations may generally be undesirable transients. The power supply voltages may serve as sources and sinks of current as the circuitry evaluates.

As mentioned above, the power gated blocks 14A-14C may have their power gated, e.g. when inactive, to reduce power consumption in the integrated circuit. According, the power gated blocks 14A-14C are each coupled to receive an enable signal (block enable in FIG. 1). The block enable signal for each block may be a separate, unique signal for that block, so that the power gated blocks 14A-14C may be individually enabled or not enabled. In some cases, one or more power gated blocks may share an enable. A shared block enable may be physically the same signal, or logically the same signal (i.e. the signals are physically separate by logically operated the same way). The integrated circuit 10 may also include one or more ungated circuit blocks such as ungated block 16. Ungated blocks may be coupled to the power supply grids 12 without any power switches, and thus may be powered up whenever the integrated circuit 10 is powered up. Ungated blocks may be blocks that are active most or all of the time, so that including the power switches and attempting to power gate them is not expected to produce much power savings, if any, for example.

A power manager 18 is coupled to the blocks 14A-14C and 16, and may be configured to monitor the activity in the blocks 14A-14C and 16 to generate the block enables for the power gated blocks 14A-14C. The activity in one block may be an indicator that another block is about to become active and should be powered up. For example, the blocks 14A-14C and 16 may be part of a pipeline. If one pipeline stage is active, it may be likely that the next state will be active soon. Similarly, in a processor, a fetch request may indicate that instructions will be fetched and decode soon, and thus the execution units may be powered up. Activity in a block may also indicate that another block is about to be idle and may be powered down. While the ungated block may not be enabled or disabled for power gating, its activity may be useful in determining if the power gated blocks may be disabled. In some embodiments, clock gating may be implemented in addition to power gating. In such embodiments, the power manager 18 may also implement the clock gating, or the clock gating may be implemented separately. While the power manager is shown as a block in FIG. 1, the power manager 18 may actually be distributed as desired.

Generally, the power manager 18 may be configured to deassert the block enable to power down a block, and to assert the block enable to power up a block. The block enable (and other signals described herein) may be asserted at one logical state and deasserted at the other logical state. For example, the signal may be asserted (indicating enable) at a low logical state (binary zero) and deasserted at a high logical state (binary one). The signal may alternatively be deasserted at the low logical state and asserted at the high logical state. Different signals may have different asserted/deasserted definitions. In some contexts, a signal may be referred to as asserted low, or alternatively asserted high, for additional clarity.

In various embodiments, a period of time may elapse after a power gated block 14A-14C has its block enable deasserted before the supply voltage has drained, and there may be a period of time after assertion of the enable before the power gated block is considered stable and ready for use. The power manager 18 may be configured to account for these times when determining if the block enable may be deasserted, and in determining when to reassert the block enable for the next power up of the block.

It is noted that, while one ungated block and three power gated blocks are shown in FIG. 1, there may generally be any number of one or more power gated blocks and ungated blocks, in various embodiments. Similarly, there may be more than one power manager 18 in the integrated circuit 10 (e.g. enabling/disabling various non-overlapping subsets of the power gated blocks).

It is noted that one or more circuit blocks may include state storage (e.g. memory, flops, registers). It may be desirable to retain the state in the state storage (or some of the state storage). In such cases, the global power grids may supply power to the state storage without power switches in the power to ground path. A separate local power grid may be provided, for example, without power switches.

Figure 2:
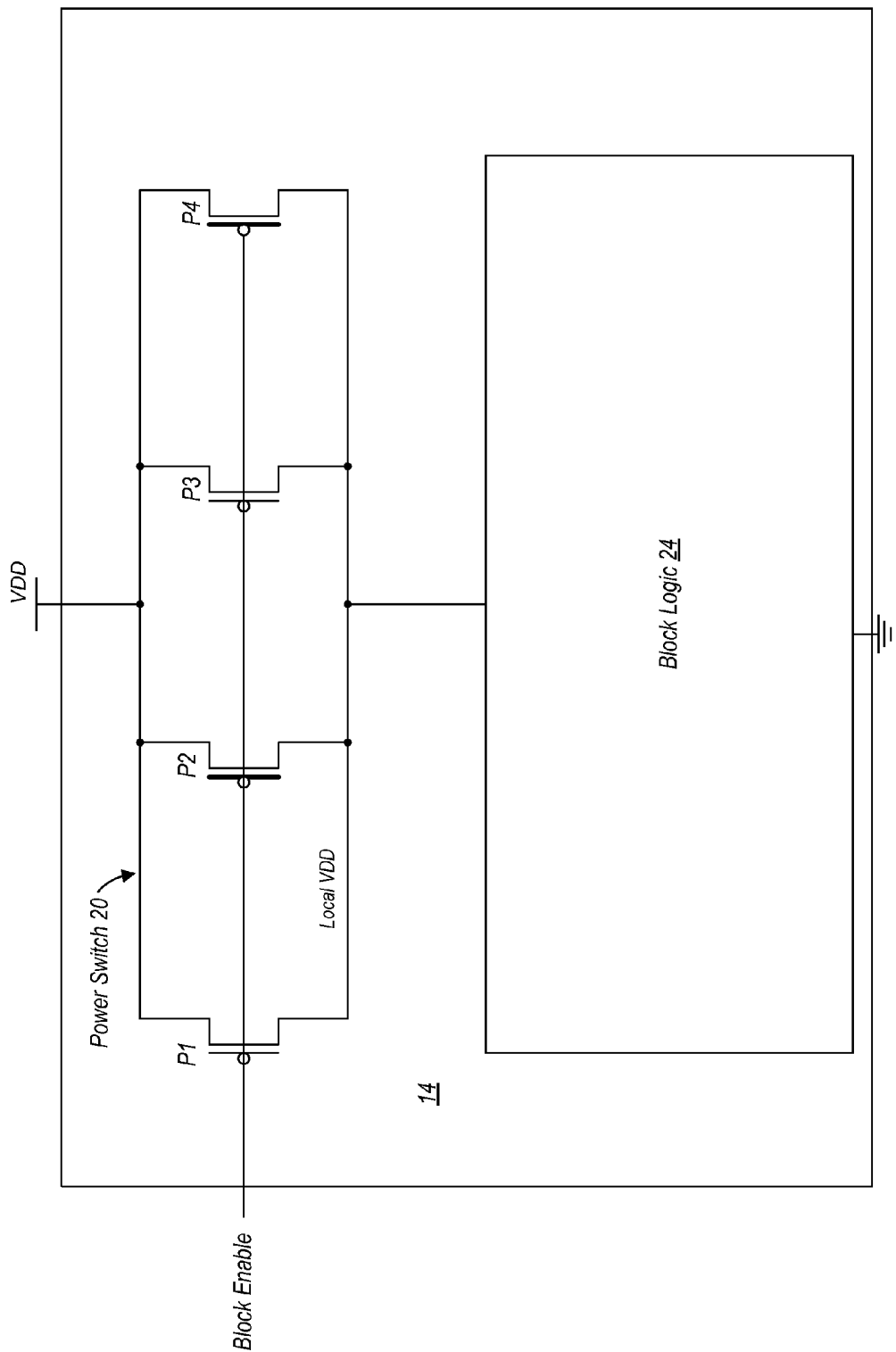
FIG. 2 is a schematic diagram of one embodiment of a power switch.

Turning now to FIG. 2, a schematic diagram of one embodiment of a power switch is shown. In the embodiment shown, power gated block 14 includes block logic 24 and power switch 20. Power gated block 14 may be any one of power gated blocks 14A-14C shown in FIG. 1, or any type of power gated circuitry as described above.

Block logic 24 may include a number of different logic gates and other types of circuitry. The logic implemented in block logic 24 may include combinational logic circuits and/or sequential logic circuits. In some embodiments, block logic 24 may also include mixed signal circuitry, thus including some analog circuits. Embodiments wherein block logic 24 may be replaced with a block of circuitry that is entirely analog are also contemplated.

Power may be provided to block logic 24 through power switch 20. In the embodiment shown, power switch 20 is configured to receive a block enable signal. In the embodiment shown, power switch 20 includes four p-type metal oxide semiconductor (PMOS) transistors, P1-P4, each of which is coupled to receive the block enable signal. The block enable signal is active low in this particular embodiment. Accordingly, when the block enable signal is asserted as a logic low, transistors P1-P4 may activate and thus couple the local $V_{DD}$ power line to the global $V_{DD}$ power line. If it is necessary or desirable to power down block logic 24 (e.g., for entering a sleep mode), the block enable signal may be deasserted (and thus transition high in this embodiment) to deactivate transistors P1-P4. When transistors P1-P4 are inactive, block logic 24 may be prevented from receiving power from $V_{DD}$.

In FIG. 2, transistors P1 and P3 are configured to activate responsive to a first nominal threshold voltage, while transistors P2 and P4 are configured to activate responsive to a second nominal threshold voltage. More particularly, transistors P1 and P3 may become active responsive to the gate-source voltage falling below the first nominal threshold voltage. Similarly, transistors P2 and P4 may become active responsive to the gate-source voltage falling below the second nominal threshold voltage. In this particular example, the second nominal threshold voltage is less than the first nominal threshold voltage. Thus, assuming a relatively constant source voltage and a falling gate voltage, transistors P1 and P3 may become active prior to transistors P2 and P4 becoming active. It is noted that, while four transistors P1-P4 are illustrated in FIG. 2 for convenience in the drawing, there may be generally any number of transistors. The transistors may be physically distributed over an integrated circuit area occupied by the block logic 24.

The respective threshold voltages of transistors P1-P4 in the embodiment shown may be determined by various properties thereof. For example, transistors P1 and P3 in the embodiment shown may have a first nominal channel density and the transistors P2 and P4 may have a second nominal channel dopant density. Thus, the transistors P1 and P3 may have a first nominal threshold voltage that is different from a second nominal threshold voltage of the transistors P2 and P4. As another example, transistors P1 and P3 in the embodiment shown may have a first nominal gate oxide thickness, while transistors P2 and P4 have a second nominal gate oxide thickness. Moreover, the gate oxide thickness of transistors P2 and P4 may be greater than that of either of transistors P1 and P3 (hence the manner in which P2 and P4 are drawn relative to P1 and P3 in FIG. 2). Transistors P2 and P4 may be more resistant to leakage currents than transistors P1 and P3 at least in part due to their relatively thicker gate oxides. However, transistors P1 and P3, in part due to their gate oxides being relatively thinner than those of transistors P2 and P4, may allow for faster switching.

Implementing power switch 20 using mixed threshold voltages may result in a circuit that enables both fast switching and reduced leakage currents. Utilizing transistors having reduced nominal threshold voltages (e.g., P1 and P3 in the embodiment shown in FIG. 2) may thus result in faster switching times for the circuit, as these transistors may turn on faster than their counterparts having higher nominal threshold voltages. The other transistors of the circuit (e.g. P2 and P4) may activate subsequent to the activation of the transistors having the reduced nominal threshold voltages, and may provide additional drive current. Furthermore, while these transistors may activate slower than those with reduced threshold voltages, they may also provide more resistance to leakage currents.

Figure 3:
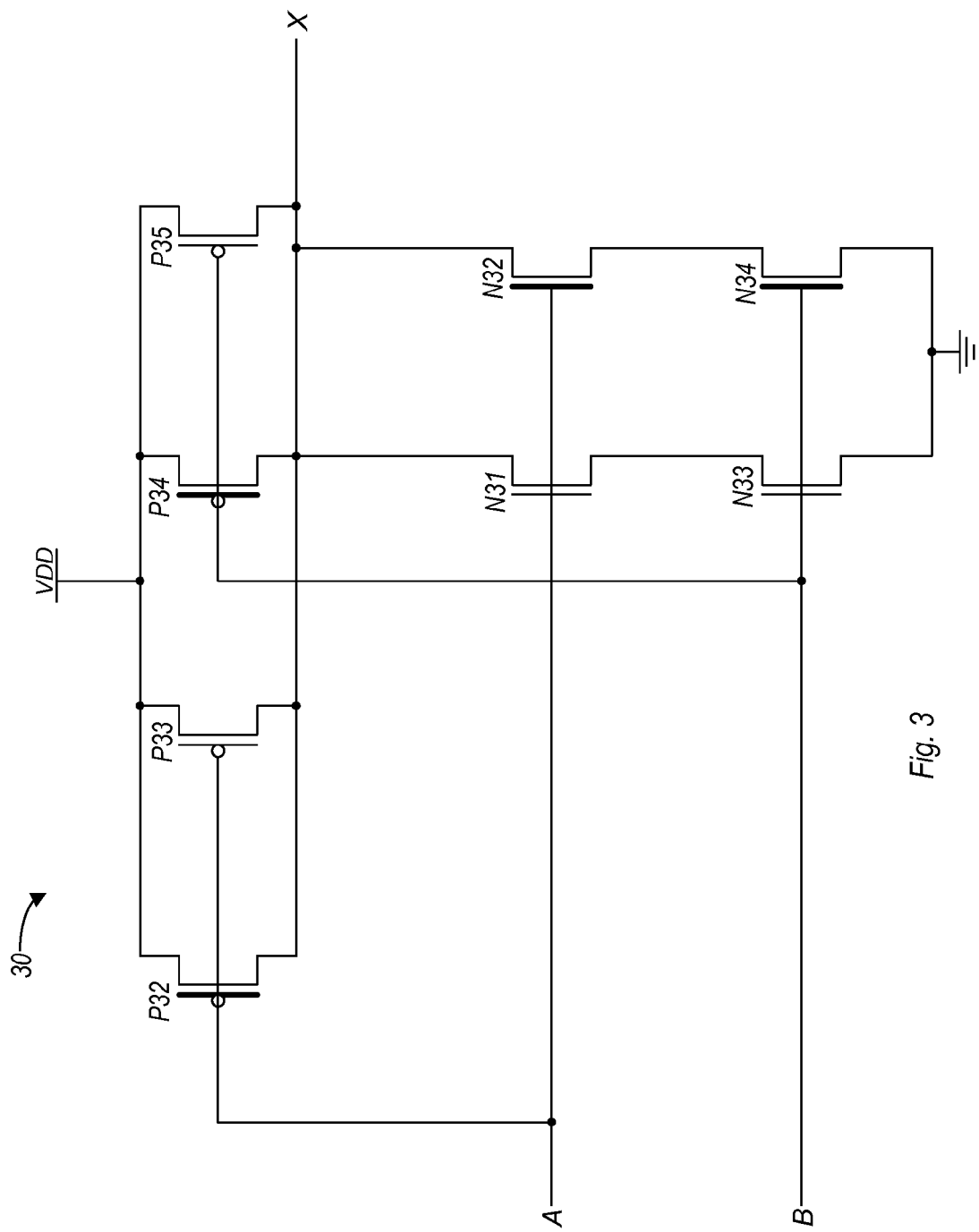
FIG. 3 is a schematic diagram of one embodiment of a NAND gate.

The principle of utilizing mixed threshold voltages for transistors of an otherwise similar type may be applied to other types of circuits as well. FIG. 3 is a schematic diagram of one embodiment of a NAND gate. In the embodiment shown, NAND gate 30 includes four PMOS transistors and four n-type metal oxide semiconductor (NMOS) transistors. Transistors P32 and P34 may be implemented with higher nominal threshold voltages. Similarly, transistors N32 and N34 may be implemented with higher nominal threshold voltages than their NMOS counterparts, N31 and N33.

In the embodiment shown, NAND gate 30 includes input terminals A and B, and output terminal X. Input terminal A is coupled to the gate terminals of P32, P33, N31, and N32, while input terminal B is coupled to the gate terminals of P34, P35, N33, and N34. When logic high voltages are applied to input terminals A and B, transistors N31-N34 may each become active. However, transistors N31 and N33 may become active before transistors N32 and N34. Thus, assuming a constant source voltage and a rising gate voltage, the gate-source voltage may reach the threshold voltage for transistors N31 and N33 prior to reaching the same for transistors N32 and N34. When each of transistors N31-N33 is active, output terminal X may be pulled low.

If logic low voltages are applied to both input terminals A and B, transistors P32-P35 may activate. However, due to the differing nominal threshold voltages, transistors P33 and P35 may activate prior to P32 and P34 doing the same. More particularly, assuming a relatively constant source voltage, a falling voltage on their respective gate terminals may result in the gate-source voltage of transistors P33 and P35 passing the threshold voltage prior to the same occurring for transistors P32 and P34.

As NAND gate 30 is configured to perform a NAND function, output terminal X may be pulled high responsive to a logic low voltage being applied to either one of input terminals A and B. Thus, if the logic values applied to input terminals A and B are mixed (i.e. a logic high voltage on one input terminal, a logic low on the other input terminal), output terminal X may nevertheless be pulled high once the transistors have switched in response to the applied logic voltages. Moreover, whenever at least one of the inputs receives a logic low input in the embodiment shown, at least one pair of PMOS transistors (P32 and P33 or P34 and P35) may become active as a result, while at least one pair of NMOS transistors (N31 and N32 or N33 and N34) may become inactive. No pull down path from output terminal X to ground is provided whenever a given pair of NMOS transistors is inactive in this embodiment. However, when either pair of PMOS transistors is active in this embodiment, a pull up path to $V_{DD}$ is provided.

Since some of the transistors in NAND gate 30 have higher nominal threshold voltages than others, leakage currents in a given logic state may be reduced. For example, when output terminal X is pulled high, the higher threshold voltages of N32 and N34 may reduce leakage currents between this terminal and ground. Similarly, whenever output terminal X is pulled low, the higher threshold voltages of transistors P32 and P34 may reduce leakage currents between this terminal and $V_{DD}$. However, since transistors having relatively lower threshold voltages (e.g., P33, P35, N31, N33) are also provided in NAND gate 30, output terminal X may respond to a new set of inputs faster due to the faster switching of these devices.

Figure 4:
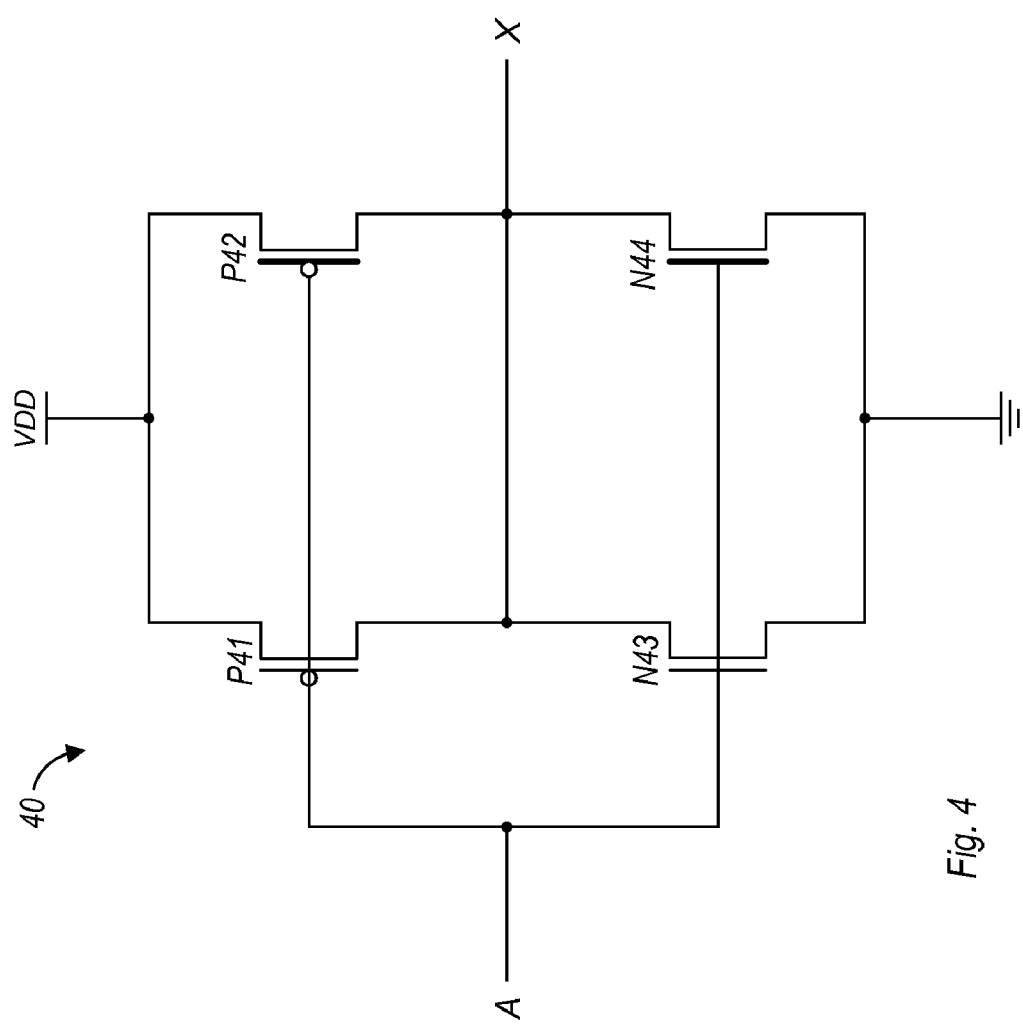
FIG. 4 is a schematic diagram of one embodiment of an inverter.

While the discussion of FIG. 3 has been directed to NAND gate 30, the principle of utilizing mixed threshold voltages for transistors of an otherwise similar type may also be applied to other types of logic circuits. FIG. 4 is a schematic diagram of one embodiment of an inverter. In the embodiment shown, inverter 40 includes two PMOS transistors, P41 and P42, and two NMOS transistors, N43 and N44. One of the PMOS transistors and one of the NMOS transistors in this example have higher threshold voltages (P42 and N44 in this example) than their counterparts of the same type (P41 and N43, respectively). Thus, the transistors having lower threshold voltages may activate quicker than their counterparts having higher threshold voltages. However, the transistors having higher threshold voltages may be more resistant to leakage currents.

During a low to high transition on input terminal A, P41 may activate before P42 does the same. During a high to low transition on input terminal A, transistors N43 may activate prior to N44. Accordingly, output terminal X may be pulled down quicker responsive to a low to high input transition, and may be pulled up quicker responsive to high to low input transition. When transistor P42 becomes active (responsive to a high to low transition) or N44 becomes active (responsive to a low to high transition), additional drive current may be provided. Furthermore, transistors P42 and N44, when inactive, may be less subject to leakage currents relative to their respective counterparts.

Figure 5:
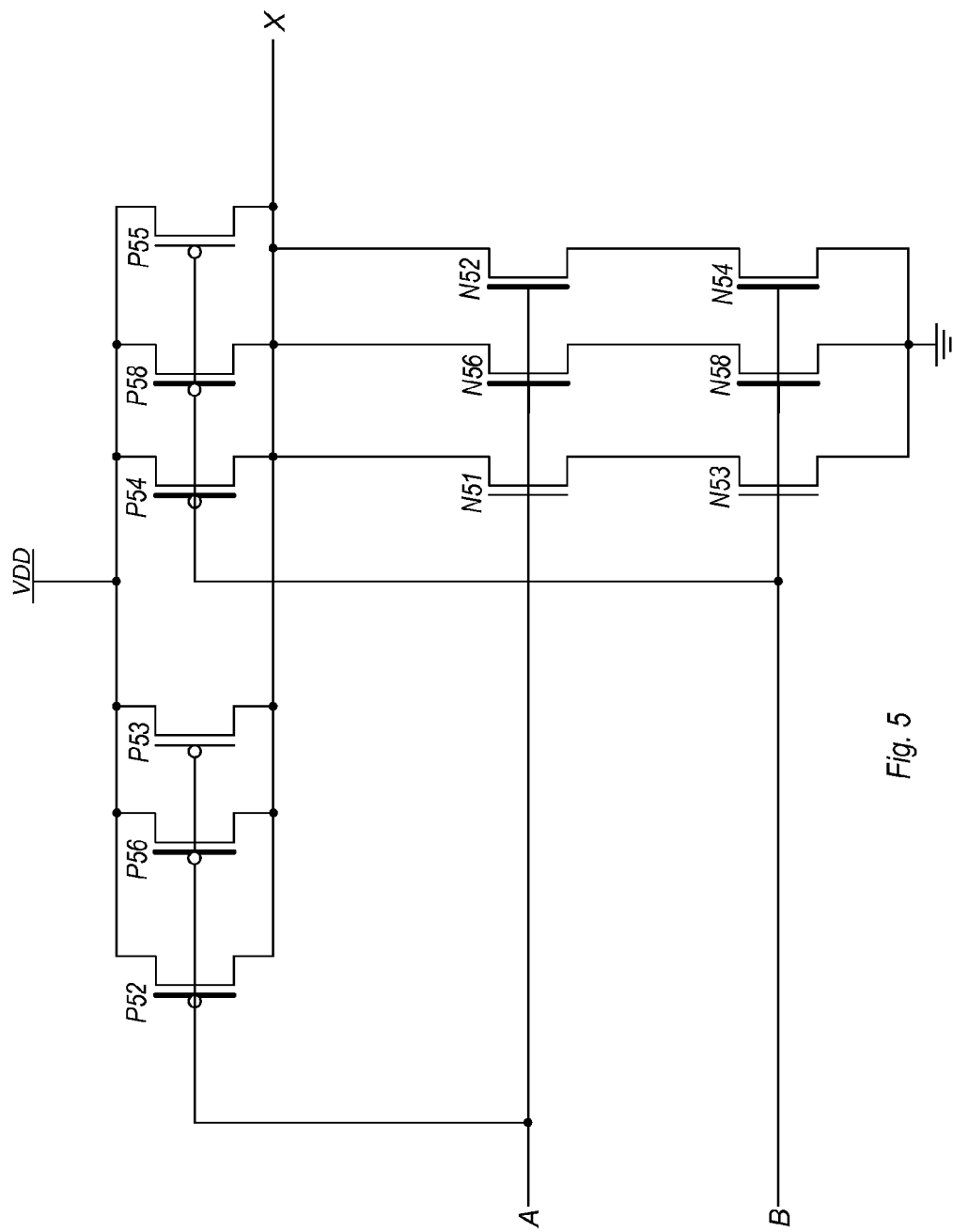
FIG. 5 is a schematic diagram of another embodiment of a NAND gate.

In each of the embodiments discussed above, the number of transistors having higher threshold voltages has been the same as the number (i.e. one high threshold NMOS and one low threshold NMOS, one high threshold PMOS to one low threshold PMOS). However, embodiments are also possible and contemplated wherein circuits are weighted toward having a greater number of high threshold transistors or a greater number of low threshold transistors. FIG. 5 provides one such example of a circuit wherein the transistor selection is weighted with emphasis on a greater number of high threshold transistors. Similarly, the power switch transistors (FIG. 2) may be weighted toward high or low threshold voltage transistors. Depending on the relative number of high threshold voltage transistors and low threshold voltage transistors, the combination may effectively be similar to a transistor having a threshold voltage between the higher threshold voltage and the lower threshold voltage. For example, if an equal number of transistors having each of two threshold voltages are used, then the effective threshold voltage may be ½ way between the two threshold voltages. Other ratios of numbers of transistors at one threshold voltage versus another may skew the effective threshold voltage toward the higher or lower threshold voltage. Furthermore, in a given semiconductor fabrication process, the number of available transistor types (having differing threshold voltages) may be more than two, and any combination of transistors at differing threshold voltages may be used.

FIG. 5 is a schematic diagram of another embodiment of a NAND gate. In the embodiment shown, NAND gate 50 is similar to NAND gate 30, but differs in that it includes additional transistors of each type having nominal threshold voltages that are greater than their reduced nominal threshold voltage counterparts. In this particular example, NAND gate 50 includes four PMOS transistors (P52, P54, P56, and P58) each having nominal threshold voltages that are greater than their reduced nominal threshold voltage counterparts, P53 and P55. Similarly, NAND gate 50 also includes four NMOS transistors (N52, N54, N56, and N58) each having nominal threshold voltages that are greater than their lower nominal threshold voltages, N51 and N53.

A circuit such as NAND gate 50 may be useful in an environment wherein fast switching speeds, high drive currents, and low leakage currents are desired. The low nominal threshold voltage transistors of the circuit may provide a speed advantage by activating faster than their high nominal threshold voltage counterparts. Meanwhile, those transistors of the circuit having higher nominal threshold voltages may provide additional drive current while being subject to lower leakage currents, even though they may not activate as fast as their lower nominal threshold voltage counterparts.

Similar circuits that emphasize switching speed over leakage are also possible. For example, an embodiment of NAND gate 50 may be implemented by replacing the low nominal threshold voltage devices with high nominal threshold voltage devices, and vice versa. In such an embodiment, four devices of a particular type (e.g. PMOS) would be low nominal threshold voltage devices while two other devices of the same type would be high nominal threshold voltage devices.

It should be noted that the number high nominal threshold voltage and low nominal threshold voltage devices may vary from one embodiment to the next. Furthermore, it is also noted that the number of low and high nominal threshold voltage devices for one given type of transistor (e.g. PMOS) may be different than the corresponding numbers for another given type of transistor (e.g. NMOS) that may be a part of the same circuit.

It should be noted that the threshold voltages discussed above are nominal threshold voltages, and that other factors may influence a threshold voltage for a given device. For example, a threshold voltage for a given transistor may vary with temperature. Accordingly, two transistors of the same type having approximately equal nominal threshold voltages may at times during operation have different threshold voltages due to temperature differences. Such temperature variation may be taken into account when designing circuits in accordance with this disclosure. Manufacturing variations may also influence the actual threshold voltages of transistors having the same nominal threshold voltage. Other parameters of the transistors may also be varied to change the nominal threshold voltage of the transistors.

Viewed in another way, the nominal threshold voltage may be the threshold voltage that a given transistor is designed to exhibit. Various manufacturing variations and/or environmental factors (e.g., temperature, operating voltage, other parameters, etc.) may cause the actual threshold voltage to vary from the nominal threshold voltage. In some embodiments, the semiconductor fabrication process used to fabricate an IC may support transistors having various nominal threshold voltages (e.g., ultra low threshold voltage, low threshold voltage, medium threshold voltage, high threshold voltage, in order of increasing nominal threshold voltage).

In a similar fashion, a nominal gate oxide thickness may be the gate oxide thickness that the transistor is designed to have. Variations in the manufacturing process may lead to variations in the gate oxide thickness of a given transistor. Still further, a nominal channel dopant density may be the channel dopant density that the transistor is designed to have. Variations in the manufacturing process may lead to variations in the channel dopant density of the given transistor.

Parameters other than gate oxide thickness may affect switching speed and sub-threshold leakage currents in transistor based circuits. One such parameter may be channel length (i.e. the length of the conduction channel between the source and drain terminals). Generally speaking, switching speed may decrease as channel length increases, while channel resistance (and therefore resistance to leakage currents) may increase as channel length increases. Thus, while the circuits discussed above utilize variations in gate oxide thickness to affect switching speed and leakage current resistance, these circuits (as well as any of the numerous variations thereof) may be implemented with transistors wherein channel lengths may be varied.

For example, consider inverter 40 of FIG. 4. In an embodiment wherein the channel lengths are varied within a given transistor type, transistors P41 and N43 may be considered to have relatively shorter channel lengths than their respective counterparts P42 and N44. Accordingly, P41 and N43 may be configured such that they activate faster than their respective counterparts, while P42 and N44 may be less subject to leakage currents when inactive.

It is further noted that embodiments wherein channel lengths and threshold voltage may be varied for a given transistor type are also possible. Referring again to FIG. 4 as an example, transistors P41 and N42 may each have relatively lower threshold voltages than their respective counterparts, N43 and N44.

While the above embodiments have used the examples of a power switch, an inverter, and two separate embodiments of a NAND gate, it is noted that the disclosure is not limited to these types of circuits. The principle of mixed transistor parameters within a given transistor type (e.g. PMOS transistors) may be applied to other types of circuitry, including other types of logic circuits (e.g., AND gates, OR gates), switches, drivers, domino circuitry, and virtually any other type of circuit based on PMOS transistors, NMOS transistors, both, and/or other transistors types.

Figure 6:
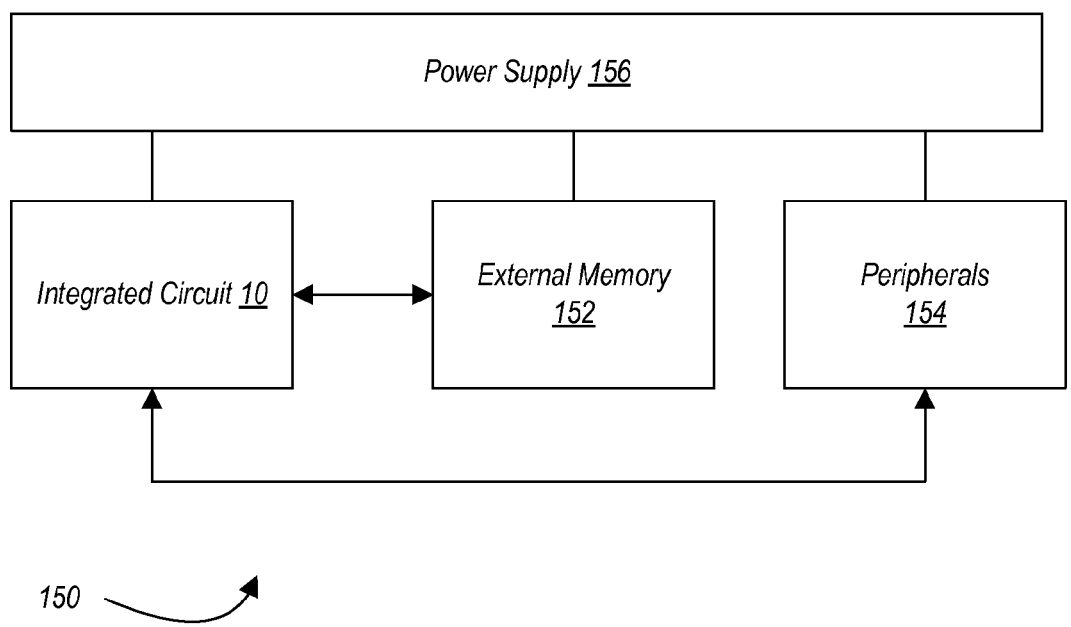
FIG. 6 is a block diagram of one embodiment of a computer system.

Turning next to FIG. 6, a block diagram of one embodiment of a system 150 is shown. In the illustrated embodiment, the system 150 includes at least one instance of an integrated circuit 10 coupled to one or more peripherals 154 and an external memory 152. Integrated circuit 10 may include various circuits including power switches and logic gates that are implemented in a manner similar to the circuits discussed above. More particularly, for given transistor types in a given circuit, various parameters that affect switching speed and/or leakage current may vary from one transistor to the next.

A power supply 156 is also provided which supplies the supply voltages to the integrated circuit 10 (e.g. $V_{SS}$ and $V_{DD}$) as well as one or more supply voltages to the memory 152 and/or the peripherals 154. In some embodiments, more than one instance of the integrated circuit 10 may be included. The integrated circuit 10 may be any of the embodiments of the integrated circuit 10 described herein.

The external memory 152 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 154 may include any desired circuitry, depending on the type of system 150. For example, in one embodiment, the system 150 may be a mobile device and the peripherals 154 may include devices for various types of wireless communication, such as wifi, Bluetooth, cellular, global position system, etc. The peripherals 154 may also include additional storage, including RAM storage, solid state storage, or disk storage. The peripherals 154 may include user interface devices such as a display screen, including touch display screens or multitouch display screens, keyboard or other keys, microphones, speakers, etc.

Numerous variations and modifications will become apparent to those skilled in the art once the above disclosure is fully appreciated. It is intended that the following claims be interpreted to embrace all such variations and modifications.

What is claimed is:

1. An electronic circuit comprising:
   a first transistor having a source terminal coupled to a first node and a drain terminal coupled to a second node, wherein the first transistor has a first nominal threshold voltage;
   a second transistor of the same type as the first transistor, the second transistor having a source terminal coupled to the first node and a drain terminal coupled to the second node, wherein the second transistor has a second nominal threshold voltage;
   a third transistor having a drain terminal coupled to the second node and a source terminal coupled to a third node, the third transistor being of a different type than the first and second transistors, wherein the third transistor has a third nominal threshold voltage, and wherein gate terminals of the first and third transistors are coupled together; and
   a fourth transistor having a drain terminal coupled to the second node and a source terminal coupled to the third node, the fourth transistor being of the same type as the third transistor, wherein the fourth transistor has a fourth nominal threshold voltage, and wherein gate terminals of the second and fourth transistors are coupled together;
   wherein each of the first, second, third, and fourth nominal threshold voltages is different from each of the other ones of the first, second, third, and fourth nominal threshold voltages.

2. The electronic circuit as recited in claim 1, further comprising a first plurality of transistors including the first transistor and a second plurality of transistors including the second transistor, wherein each of the transistors of the first plurality is configured to activate based on the first nominal threshold voltage, and wherein each of the transistors of the second plurality is configured to activate based on the second nominal threshold voltage.

3. The electronic circuit as recited in claim 2, further comprising a third plurality of transistors including the third transistor and a fourth plurality of transistors including the fourth transistor, wherein each of the third plurality of transistors is configured to activate based on the third nominal threshold voltage and wherein each of the fourth plurality of transistors is configured to activate based on the fourth nominal threshold voltage.

4. The electronic circuit as recited in claim 3, wherein each transistor of the first and second pluralities of transistors is a p-type metal oxide semiconductor (PMOS) transistor, and wherein each transistor of the third and fourth plurality of transistors is an n-type metal oxide semiconductor (NMOS) transistor.

5. The electronic circuit as recited in claim 1, wherein the first transistor has a first nominal gate oxide thickness, and wherein the second transistor has a second nominal gate oxide thickness different from the first nominal gate oxide thickness.

6. The electronic circuit as recited in claim 1, wherein the first transistor has a first nominal channel dopant density, and wherein the second transistor has a second nominal channel dopant density different from the first channel dopant density.

7. The electronic circuit as recited in claim 1, wherein the electronic circuit includes a NAND gate.

8. The electronic circuit as recited in claim 1, wherein the electronic circuit includes an inverter.

9. A logic gate comprising:
   a plurality of p-type metal oxide semiconductor (PMOS) transistors including a first subset of PMOS transistors having a first PMOS transistor, wherein each PMOS transistor of the first subset of PMOS transistors is configured to activate based on a first gate-source voltage, and a second subset of PMOS transistors including a second PMOS transistor, wherein each PMOS transistor of the second subset of PMOS transistors is configured to activate responsive to a second gate-source voltage different from the first gate-source voltage; and
   a plurality of n-type metal oxide semiconductor (NMOS) transistors including a first subset of NMOS transistors having a first NMOS transistor, wherein each NMOS transistor of the first subset of NMOS transistors is configured to activate based on a third gate-source voltage, and a second subset of NMOS transistors including a second NMOS transistor, wherein each NMOS transistor of the second subset of NMOS transistors is configured to activate responsive to a fourth gate-source voltage different from the third gate-source voltage;
   wherein a gate terminal of each of the plurality of PMOS transistors is coupled to a corresponding gate terminal of a corresponding one of the plurality of NMOS transistors.

10. The logic gate as recited in claim 9, wherein the first subset of PMOS transistors includes a greater number of PMOS transistors than the second subset of PMOS transistors.

11. The logic gate as recited in claim 9, wherein the first subset of NMOS transistors includes a greater number of NMOS transistors than the second subset of NMOS transistors.

12. The logic gate as recited in claim 9, wherein the logic gate is configured to perform at least one of a NAND function and an invert function.

13. An integrated circuit comprising:
   a plurality of logic gates, wherein the power switch circuit and each of the plurality of logic gates includes a first plurality of p-type metal oxide semiconductor (PMOS) transistors, a second plurality of PMOS transistors, a first plurality of n-type metal oxide semiconductor (NMOS) transistors, and a second plurality of NMOS transistors, wherein:
   each of the PMOS transistors of the first plurality of PMOS transistors is configured to become active responsive to a gate-source voltage less than a first nominal threshold voltage;
   each of the PMOS transistors of the second plurality of PMOS transistors is configured to become active responsive to a gate-source voltage less than a second nominal threshold voltage;
   each of the NMOS transistors of the first plurality of NMOS transistors is configured to become active responsive to a gate-source voltage greater than a third nominal threshold voltage;
   each of the NMOS transistors of the second plurality of NMOS transistors is configured to become active responsive to a gate-source voltage greater than a fourth nominal threshold voltage;
   wherein a gate terminal of each of the first plurality of PMOS transistors is coupled to a gate terminal of a corresponding one of the first plurality of NMOS transistors; and
   wherein a gate terminal of each of the second plurality of PMOS transistors is coupled to a gate terminal of a corresponding one of the second plurality of NMOS transistors.

14. The integrated circuit as recited in claim 13, wherein the first nominal threshold voltage is less than the second nominal threshold voltage, and wherein the third nominal threshold voltage is greater than the fourth nominal threshold voltage.

15. The integrated circuit as recited in claim 13, wherein each of the first plurality of PMOS transistors has a channel dopant density different from that of the second plurality of PMOS transistors, and wherein each of the first plurality of NMOS transistors has a channel dopant density different from that of the second plurality of NMOS transistors.

16. The integrated circuit as recited in claim 13, wherein at least one of the plurality of logic gates includes a greater number of the first plurality of PMOS transistors than of the second plurality of PMOS transistors, and further includes a greater number of the first plurality of NMOS transistors than of the second plurality of NMOS transistors.

17. The integrated circuit as recited in claim 13, further comprising a power switch, wherein the power switch includes one or more of the first plurality of NMOS transistors and one or more of the second plurality of NMOS transistors.

18. The integrated circuit as recited in claim 13, wherein at least one of the plurality of logic gates is configured to perform a NAND function, and wherein at least one of the plurality of logic gates is configured to perform an invert function.

* * * * *